United States Patent
Wang et al.

(10) Patent No.: US 12,317,462 B2
(45) Date of Patent: May 27, 2025

(54) ELECTRONIC PACKAGE AND METHOD OF MANUFACTURING THE SAME

(71) Applicant: CHIPBOND TECHNOLOGY CORPORATION, Hsinchu (TW)

(72) Inventors: Chen-Yu Wang, Hsinchu (TW); Pai-Sheng Cheng, Hsinchu (TW); Huan-Kuen Chen, Taichung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 220 days.

(21) Appl. No.: 18/221,461

(22) Filed: Jul. 13, 2023

(65) Prior Publication Data

US 2024/0074127 A1    Feb. 29, 2024

(30) Foreign Application Priority Data

Aug. 23, 2022   (TW) .................................. 111131739

(51) Int. Cl.
*H05K 9/00*       (2006.01)
*H05K 1/05*       (2006.01)
*H05K 1/18*       (2006.01)

(52) U.S. Cl.
CPC ............. *H05K 9/0037* (2013.01); *H05K 1/05* (2013.01); *H05K 1/181* (2013.01); *H05K 9/0088* (2013.01); *H05K 2201/0104* (2013.01); *H05K 2201/10977* (2013.01)

(58) Field of Classification Search
CPC .................. H05K 9/0088; H05K 2201/10977
See application file for complete search history.

(56) References Cited

U.S. PATENT DOCUMENTS

| | | | |
|---|---|---|---|
| 9,236,356 B2* | 1/2016 | Yang | H01L 23/552 |
| 9,966,343 B2* | 5/2018 | Kawabata | H01L 25/50 |
| 2015/0296667 A1* | 10/2015 | Hirose | H01L 25/50 |
| | | | 427/126.2 |

(Continued)

FOREIGN PATENT DOCUMENTS

| | | |
|---|---|---|
| CN | 114650648 A | 6/2022 |
| JP | 2011-258920 A | 12/2011 |

(Continued)

OTHER PUBLICATIONS

Taiwanese Office Action mailed Jul. 3, 2023 for Taiwanese Patent Application No. 111131739, 5 pages.

(Continued)

*Primary Examiner* — Sherman Ng
(74) *Attorney, Agent, or Firm* — Demian K. Jackson; Jackson IPG PLLC (57) ABSTRACT

In a method of manufacturing an electronic package, first grooves are formed on a circuit structure and a second groove is formed in each of the first grooves to allow the circuit structure to become circuit layers. Owing to the second groove is narrower than the first groove, each of the circuit layers has an encircled surface and a notch located on the encircled surface. When a shielding layer is provided to cover an encapsulating body located on the circuit layer, a space of the notch is not covered by the shielding layer such that a portion to be removed of the shielding layer will not remain on the electronic package to become burr after removing the portion to be removed.

14 Claims, 9 Drawing Sheets

(56) References Cited

U.S. PATENT DOCUMENTS

| | | | |
|---|---|---|---|
| 2018/0286816 A1* | 10/2018 | Kitazaki | ............. H01L 23/3121 |
| 2018/0286817 A1* | 10/2018 | Kitazaki | ................. H01L 21/78 |
| 2020/0328143 A1 | 10/2020 | Marinov | |
| 2022/0246772 A1 | 8/2022 | Wilcoxon et al. | |
| 2023/0187374 A1* | 6/2023 | Jian | ....................... H01L 21/561 |
| | | | 257/224 |

FOREIGN PATENT DOCUMENTS

| | | |
|---|---|---|
| JP | 2015-115552 A | 6/2015 |
| KR | 10-2011-0134168 A | 12/2011 |
| KR | 10-2017-0128781 A | 11/2017 |
| KR | 10-2018-0108368 A | 10/2018 |
| TW | 200822829 A | 5/2008 |

OTHER PUBLICATIONS

Japanese office action mailed Aug. 27, 2024 for Japanese patent application No. 2023-112308, 5 pages.
Korean office action mailed Sep. 23, 2024 for Korean patent application No. 10-2023-0088263, 10 pages.

* cited by examiner

ELECTRONIC PACKAGE AND METHOD OF MANUFACTURING THE SAME

FIELD OF THE INVENTION

This invention relates to an electronic package and a method of manufacturing the same, and more particularly to an electronic package with lower formation of burrs and a method of manufacturing the same.

BACKGROUND OF THE INVENTION

Figure 8:
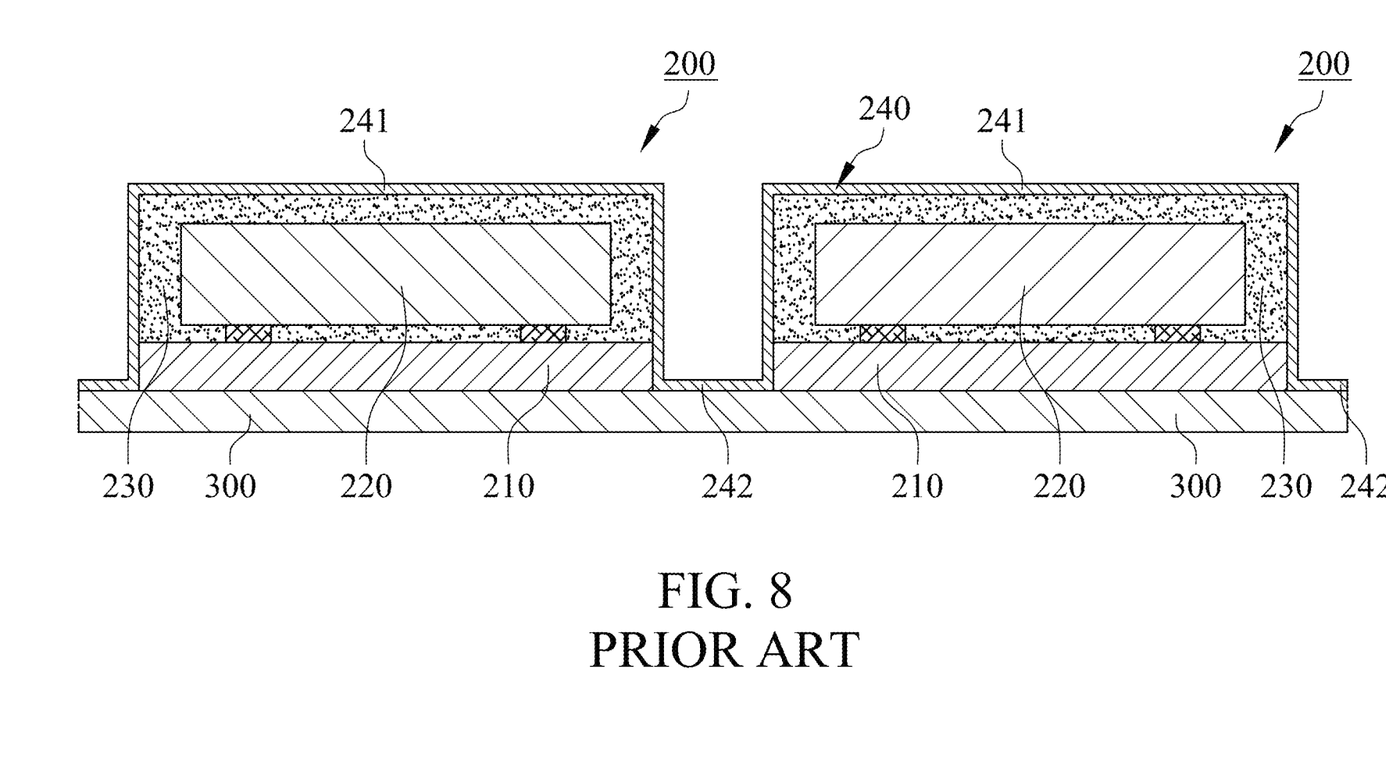
FIGS. 8 and 9 are cross-section view diagrams illustrating a conventional electronic package.

As shown in FIG. 8, a conventional electronic package 200 includes a circuit layer 210, an electronic element 220 (e.g. chip) mounted on the circuit layer 210, and an encapsulating body 230 provided to encapsulate the electronic element 220. In order to protect the electronic element 220 from electromagnetic interference (EMI), the electronic package 200 is placed on a carrier 300 and covered by a shielding layer 240. The shielding layer 240 includes a covering portion 241 provided to cover the electronic package 200 and a portion 242 to be removed which is connected to the covering portion 241.

Figure 9:
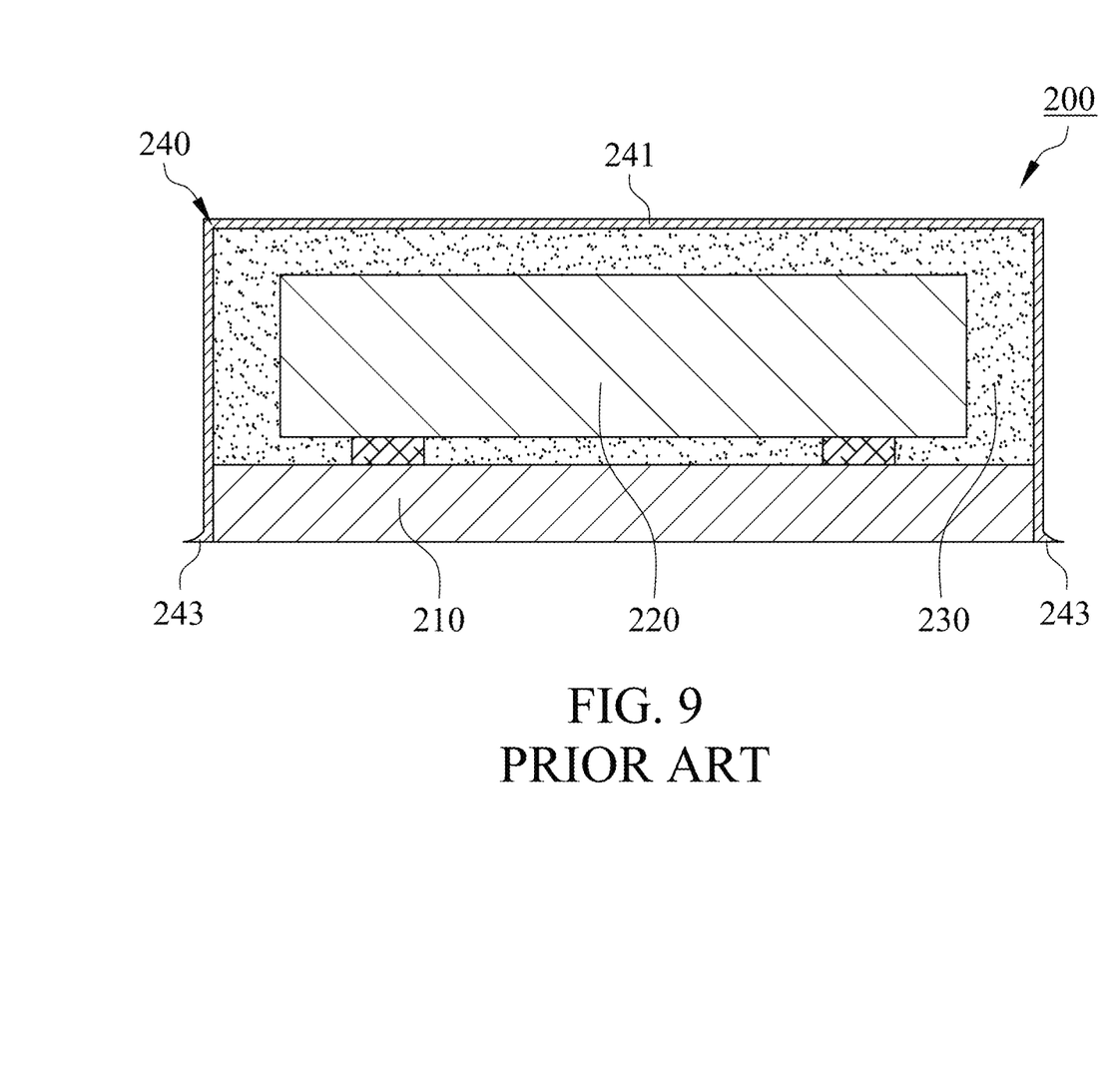

Next, the carrier 300 and the portion 242 of the shielding layer 240 are removed as shown in FIG. 9. However, after removing the portion 242, a part of the portion 242 may remain on the covering portion 241 to become a burr 243 which may lower the yield of the electronic package 200.

SUMMARY

One object of the present invention is to provide an electronic package and a method of manufacturing the same. It is available to lower the formation of burrs resulted from a portion to be removed of a shielding layer remaining on an electronic package, and further to enhance the yield of the electronic package.

An electronic package of the present invention includes a circuit layer, an electronic element, an encapsulating body and a shielding case. The circuit layer has a first conductive surface, a second conductive surface, an encircled surface and a notch, the encircled surface is located between the first and second conductive surfaces, the notch is located on the encircled surface and has a space. The electronic element is mounted on the second conductive surface of the circuit layer. The encapsulating body is provided to encapsulate the electronic element and cover the second conductive surface of the circuit layer. The shielding case includes a first shielding portion which is provided to cover the encapsulating body, and the space of the notch is not covered by the first shielding portion.

A method of manufacturing an electronic package of the present invention includes the steps of: mounting a plurality of electronic elements on a second bonding surface of a circuit structure; encapsulating the electronic elements by an encapsulating layer, the second bonding surface of the circuit structure is covered by the encapsulating layer; placing the encapsulating layer on a first carrier to expose a first bonding surface of the circuit structure; forming a plurality of first grooves on the first bonding surface of the circuit structure along a cutting line; forming a second groove in each of the first grooves to allow the circuit structure to become a plurality of circuit layers each having a first conductive surface and a second conductive surface and allow the encapsulating layer to become a plurality of encapsulating bodies, wherein an semi-finished electronic package includes one of the circuit layers, one of the electronic elements mounted on the second conductive surface and one of the encapsulating bodies configured to encapsulate the plurality of electronic elements, wherein a second width of the second groove is less than a first width of the first groove such that each of circuit layers has an encircled surface and a notch located on the encircled surface; placing the semi-finished electronic package on a second carrier to allow the circuit layer of the semi-finished electronic package to be faced toward a surface of the second carrier, the encapsulating body, the encircled surface and the notch of the circuit layer and the surface of the second carrier are exposed; forming a shielding layer which includes a portion to be removed and a first shielding portion, the surface of the second carrier is covered by the portion to be removed, the encapsulating body is covered by the first shielding portion, wherein a space of the notch is not covered by the shielding layer; and removing the second carrier and the portion to be removed of the shielding layer to allow the semi-finished electronic package to become an electronic package and allow the shielding layer to become a shielding case of the electronic package, the shielding case includes the first shielding portion and is provided to not cover the space of the notch.

Owing to the second groove is narrower than the first groove in width size, the circuit layer has the encircled surface and the notch located on the encircled surface. The space of the notch is visible while the encapsulating body is covered by the shielding layer so the shielding layer will not remain on the electronic package to become burr as removing the portion to be removed of the shielding layer.

DETAILED DESCRIPTION OF THE INVENTION

A method of manufacturing an electronic package 100 in accordance with one embodiment of the present invention are shown in FIGS. 1 to 7.

Figure 1:
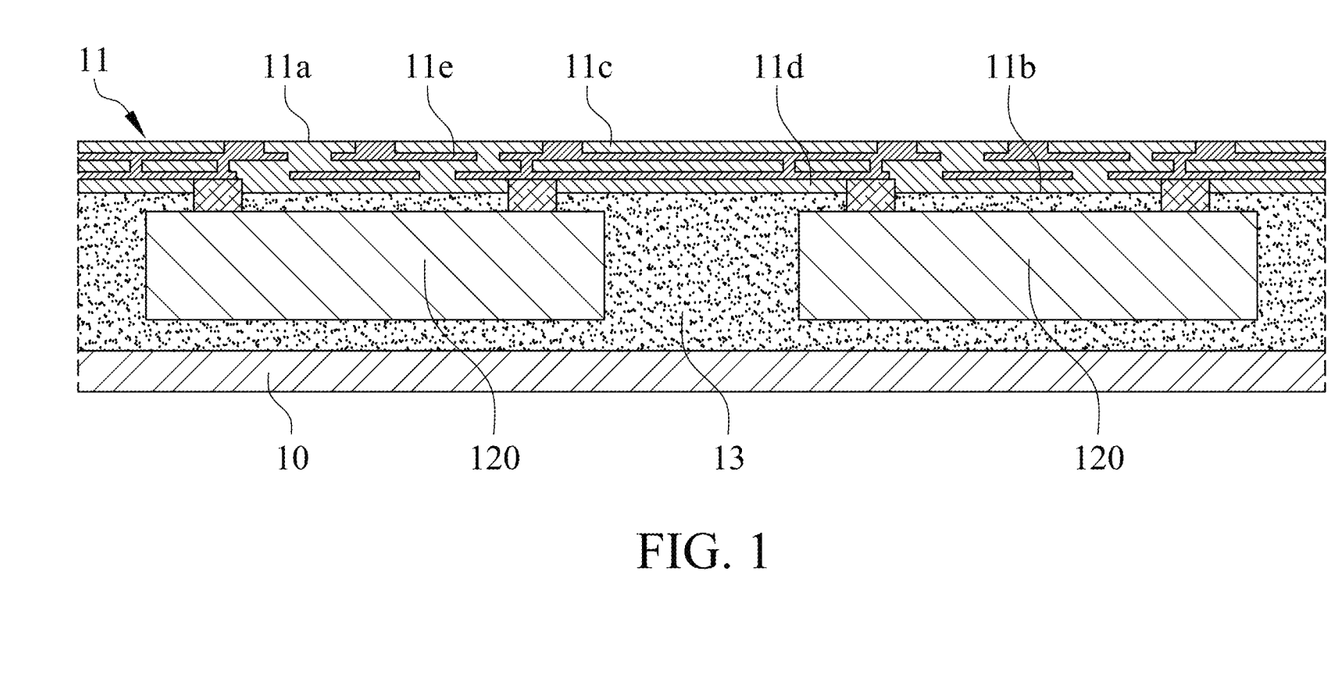
FIGS. 1 to 5 are cross-section view diagrams illustrating a method of manufacturing an electronic package in accordance with one embodiment of the present invention.

With reference to FIG. 1, a plurality of electronic elements 120 are mounted on a second bonding surface 11b of a circuit structure 11, and an encapsulating layer 13 is provided to encapsulate the electronic elements 120 and cover the second bonding surface 11b. The electronic elements 120 are, but not limit to, chips. The circuit structure 11 may be a redistribution circuit structure and includes a first dielectric layer 11c, a second dielectric layer 11d and at least one circuit line 11e. The circuit line 11e is located between the first dielectric layer 11c and the second dielectric layer 11d, and the first dielectric layer 11c and the second dielectric layer 11d may be made of insulating material, such as polyimide (PI). Next, the encapsulating layer 13 is placed on a first carrier 10 to expose a first bonding surface 11a of the circuit structure 11. The first bonding surface 11a and the second bonding surface 11b are the different surfaces of the circuit structure 11.

Figure 2:
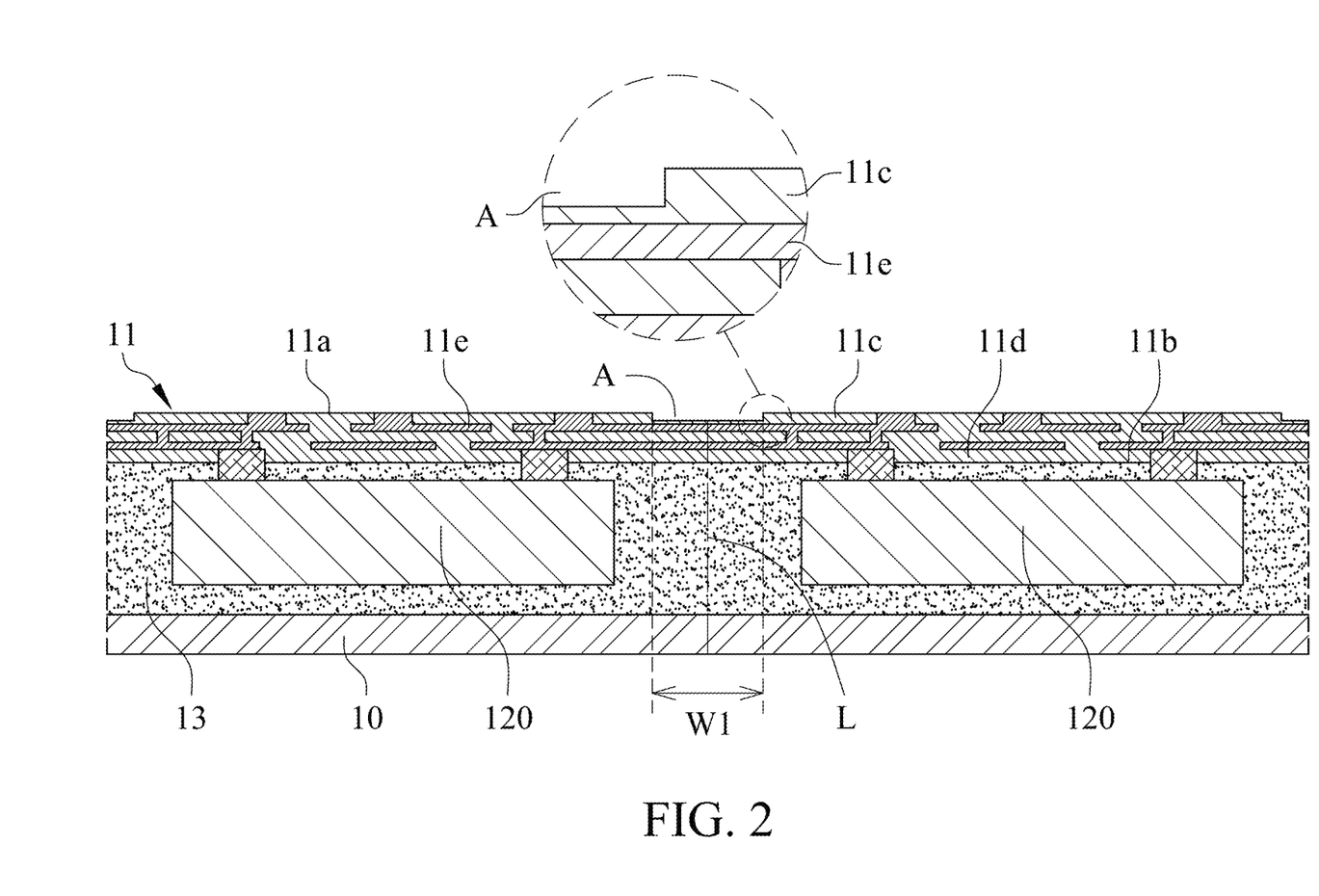

With reference to FIG. 2, a plurality of first grooves A are formed on the first bonding surface 11a of the circuit structure 11 along a cutting line L. In this embodiment, the first grooves A are formed on the first dielectric layer 11c of the circuit structure 11 by cutting or laser scribing.

Figure 3:
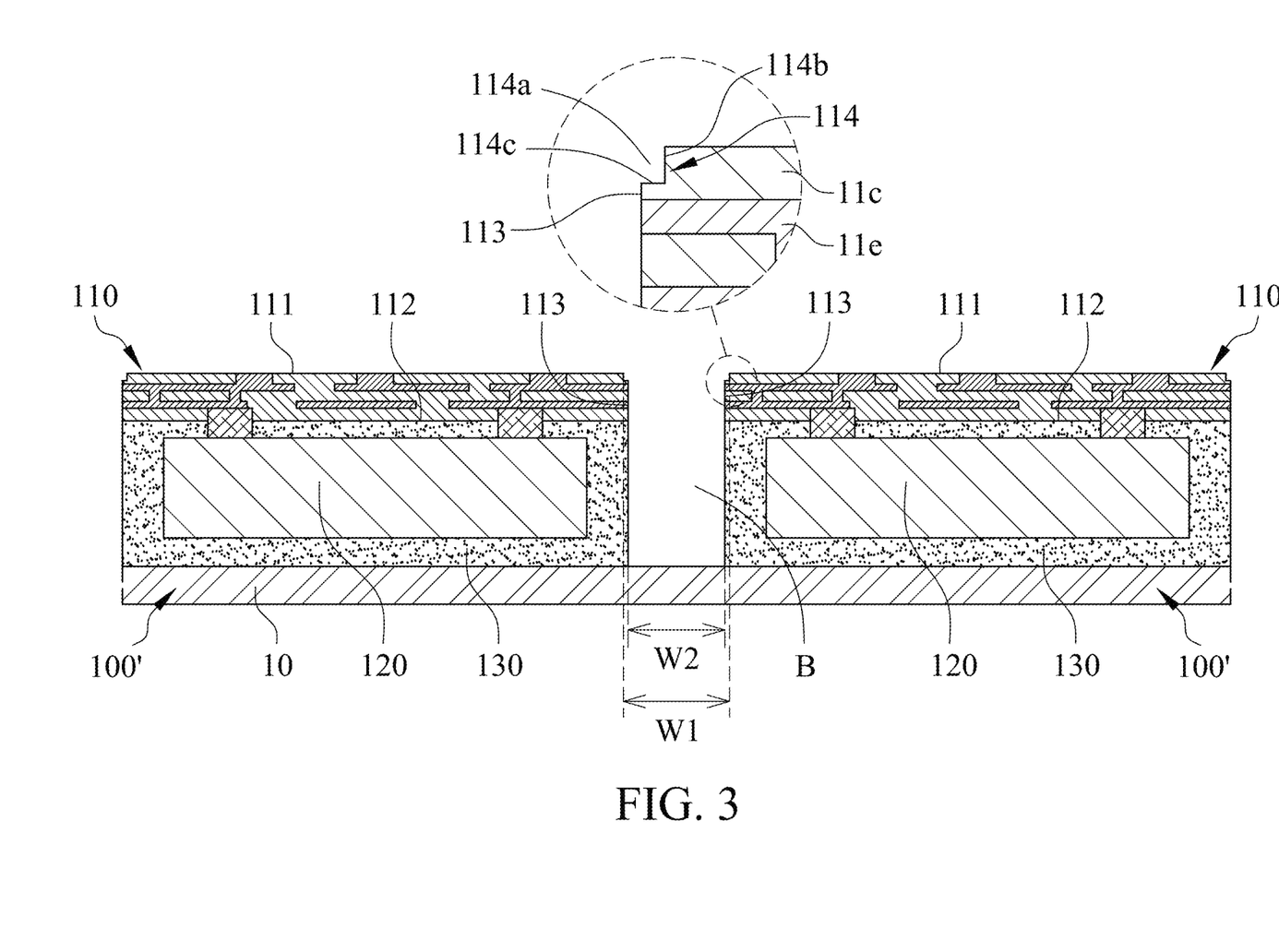

With reference to FIGS. 2 and 3, a second groove B is formed on each of the first grooves A to allow the circuit structure 11 to become a plurality of circuit layers 110 and allow the encapsulating layer 13 to become a plurality of encapsulating bodies 130. The second grooves B can be formed by cutting or laser scribing. Each of the circuit layers 110 has a first conductive surface 111 and a second conductive surface 112 which are different surfaces of the circuit layer 110, and the electronic element 120 is mounted on the second conductive surface 112. A second width W2 of the second groove B is less than a first width W1 of the first groove A, thus the circuit layer 110 has an encircled surface 113 and a notch 114 located on the encircled surface 113. The encircled surface 113 is located between the first conductive surface 111 and the second conductive surface 112. The notch 114 has a space 114a, a first surface 114b and a second surface 114c. The first surface 114b is connected to the first conductive surface 111 of the circuit layer 110, and the second surface 114c is connected to the encircled surface 113 and the first surface 114b.

With reference to FIG. 3, after forming the second groove B, a semi-finished electronic package 100' including the circuit layer 110, the electronic element 120 mounted on the second conductive surface 112 and the encapsulating body 130 provided to encapsulate the electronic element 120 is obtained. Next, as shown in FIG. 4, the semi-finished electronic packages 100' are placed on a second carrier 20, the circuit layer 110 of each of the semi-finished electronic packages 100' is faced toward a surface 21 of the second carrier 20, and the encapsulating body 130, the encircled surface 113 and the notch 114 of the circuit layer 110 and the surface 21 of the second carrier 20 are exposed.

Figure 4:
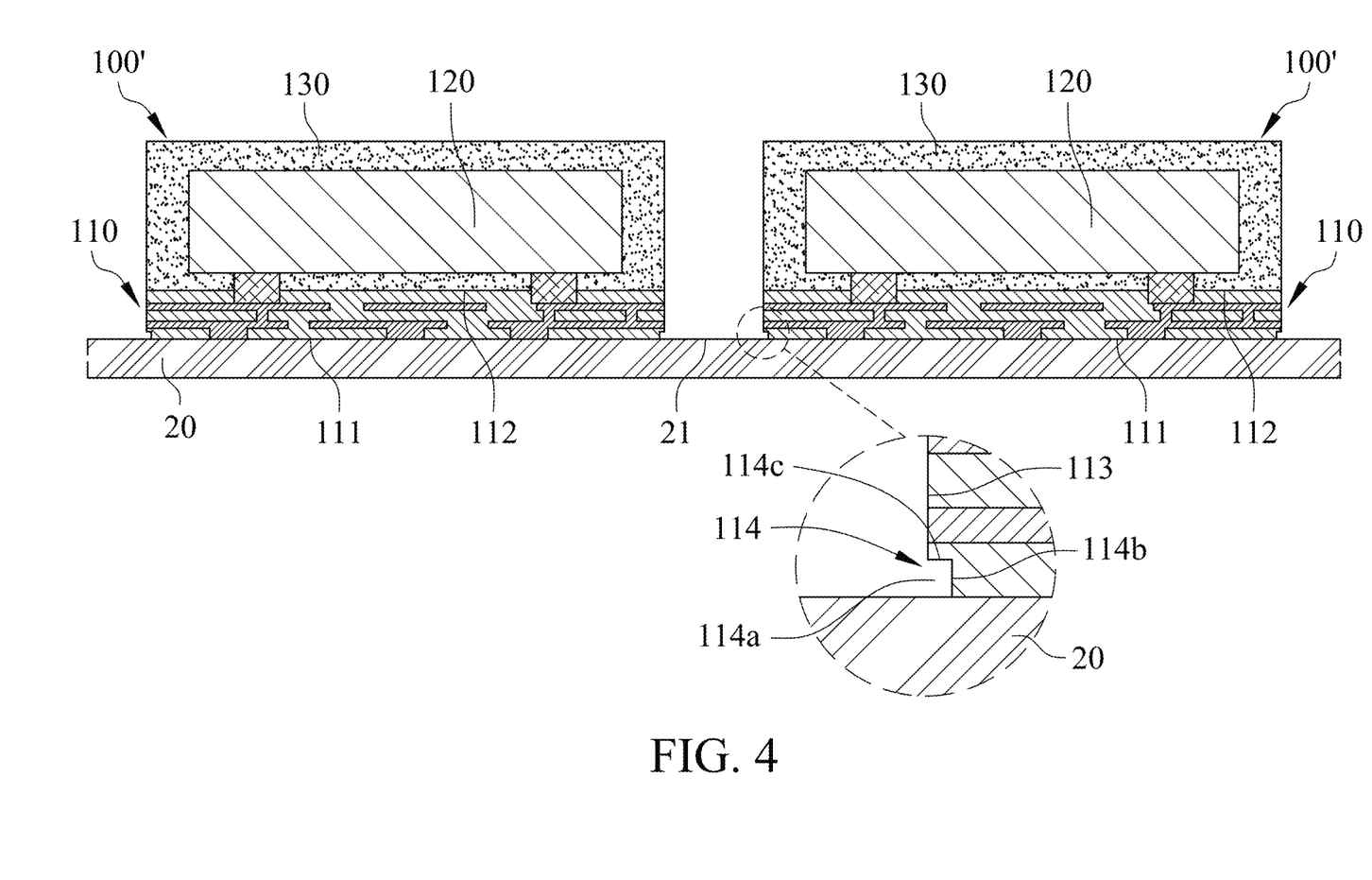
Figure 5:
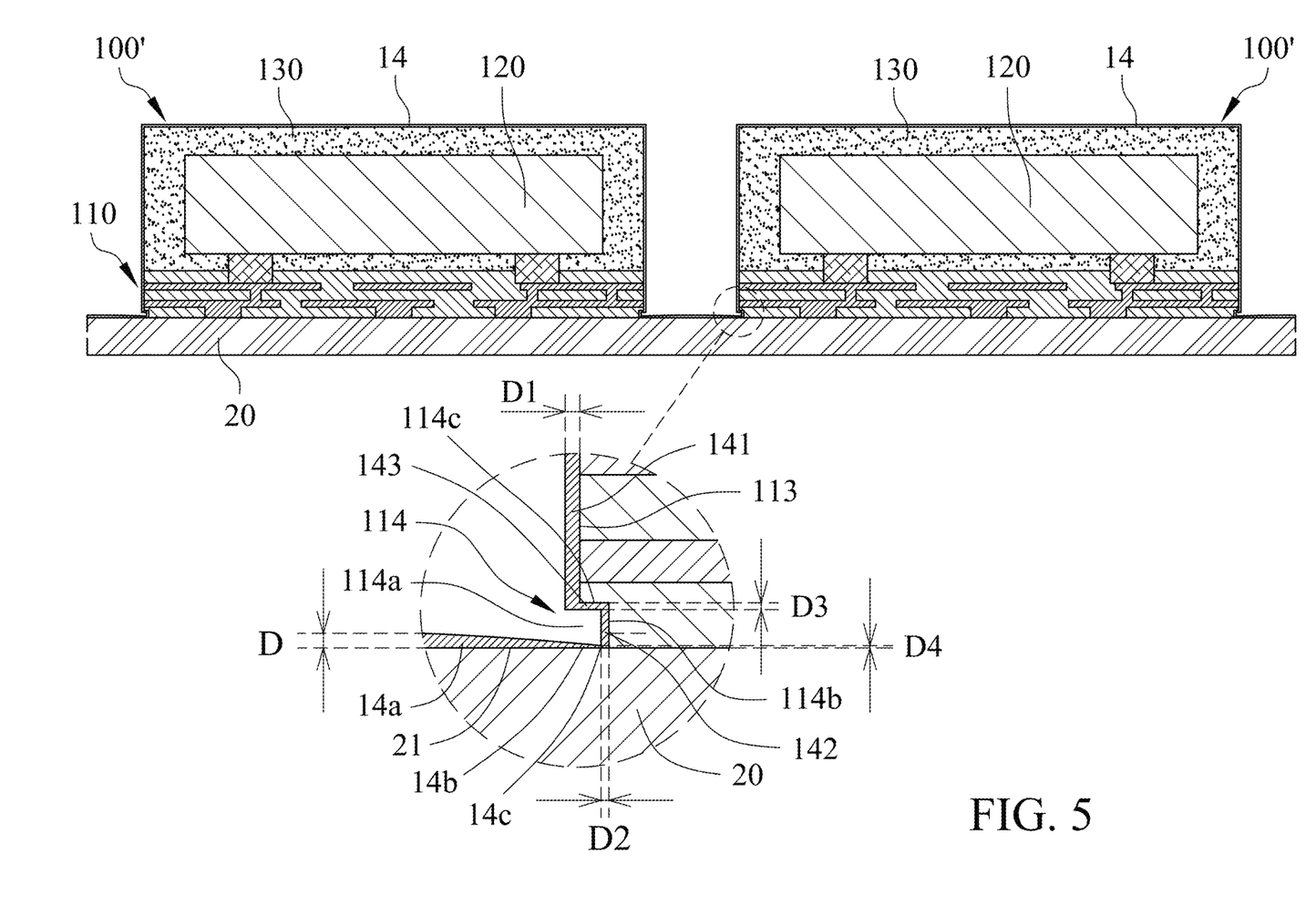

With reference to FIGS. 4 and 5, after placing the semi-finished electronic packages 100' on the second carrier 20, a shielding layer 14 is provided to cover the encapsulating body 130 and the surface 21 of the second carrier 20, and the space 114a of the notch 114 is not covered by the shielding layer 14. The shielding layer 14 includes a portion 14a to be removed and a first shielding portion 141, the portion 14a to be removed covers the surface 21 of the second carrier 20, and the first shielding portion 141 covers the encapsulating body 130. In this embodiment, the first shielding portion 141 also covers the encircled surface 113 of the circuit layer 110, but not cover the space 114a of the notch 114, and the portion 14a to be removed has a thickness D which is decreased gradually toward the notch 114. The shielding layer 14 can be formed by sputtering, spray coating or evaporation, and can be made of metal, alloy or chemical compounds. The shielding layer 14 further includes a second shielding portion 142 in this embodiment, the second shielding portion 142 is formed on the first surface 114b of the notch 114 as forming the first shielding portion 141. The second shielding portion 142 covers the first surface 114b of the notch 114, and a second thickness D2 of the second shielding portion 142 is less than a first thickness D1 of the first shielding portion 141 owing to the shelter provided by the second surface 114c of the notch 114.

With reference to FIG. 5, one end 14b of the portion 14a to be removed is connected to the second shielding portion 142, and the end 14b is in the space 114a of the notch 114. Preferably, a fourth thickness D4 of the end 14b is less than or equal to the second thickness D2 of the second shielding portion 142.

As shown in FIG. 5, the shielding layer 14 of this embodiment further includes a third shielding portion 143 which is formed on the second surface 114c of the notch 114 as forming the first shielding portion 141 and the second shielding portion 142. The third shielding portion 143 covers the second surface 114c of the notch 114, and preferably, both sides of the third shielding portion 143 are connected to the first shielding portion 141 and the second shielding portion 142, respectively. The second surface 114c of the notch 114 is a shelter, so a third thickness D3 of the third shielding portion 143 is less than the first thickness D1 of the first shielding portion 141.

Figure 6:
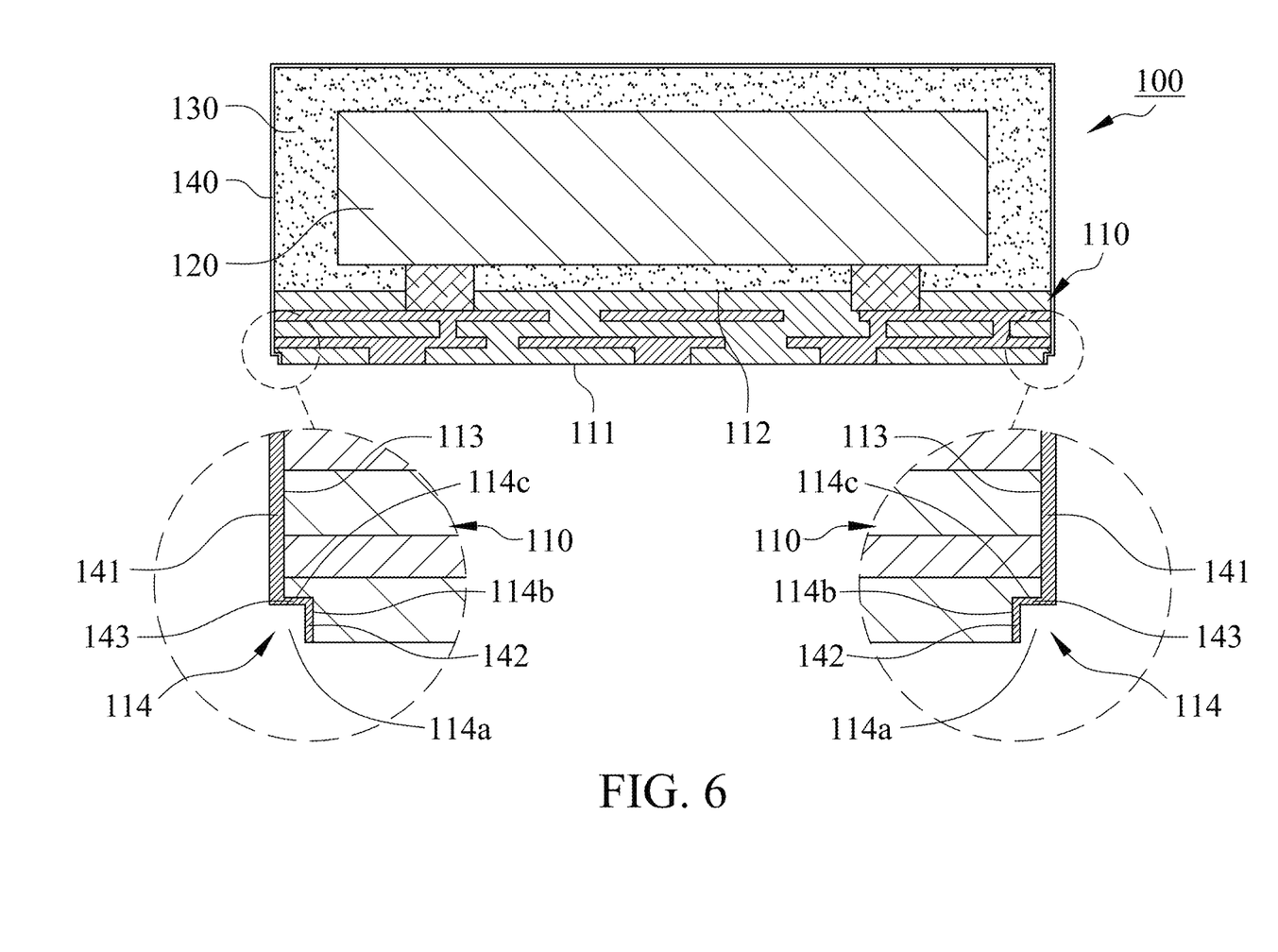
FIG. 6 is a cross-section view diagram illustrating an electronic package in accordance with one embodiment of the present invention.

With reference to FIGS. 5 and 6, after forming the shielding layer 14, the second carrier 20 and the portion 14a to be removed are removed to allow the semi-finished electronic packages 100' to become a plurality of electronic packages 100 and allow the shielding layer 14 to become a plurality of shielding cases 140 covering the electronic packages 100. In this embodiment, after removing the second carrier 20 and the portion 14a to be removed, each of the shielding cases 140 involves the first shielding portion 141 provided to cover the encapsulating body 130 and the encircled surface 113, the second shielding portion 142 provided to cover the first surface 114b of the notch 114, and the third shielding portion 143 provided to cover the second surface 114c of the notch 114. And the space 114a of the notch 114 is not covered by the shielding case 140.

With reference to FIGS. 5 and 6, owing to the thickness D of the portion 14a to be removed is reduced gradually toward the notch 114, the structural strength of a joint 14c of the end 14b which is connected to the second shielding portion 142 is lower than that of the portion 14a to be removed which is located outside of the notch 114, and the portion 14a to be removed can be broken at the joint 14c and separated from the second shielding portion 142 while removing the second carrier 20 and the portion 14a to be removed, thus the portion 14a to be removed will not remain on the second shielding portion 142.

Figure 7:
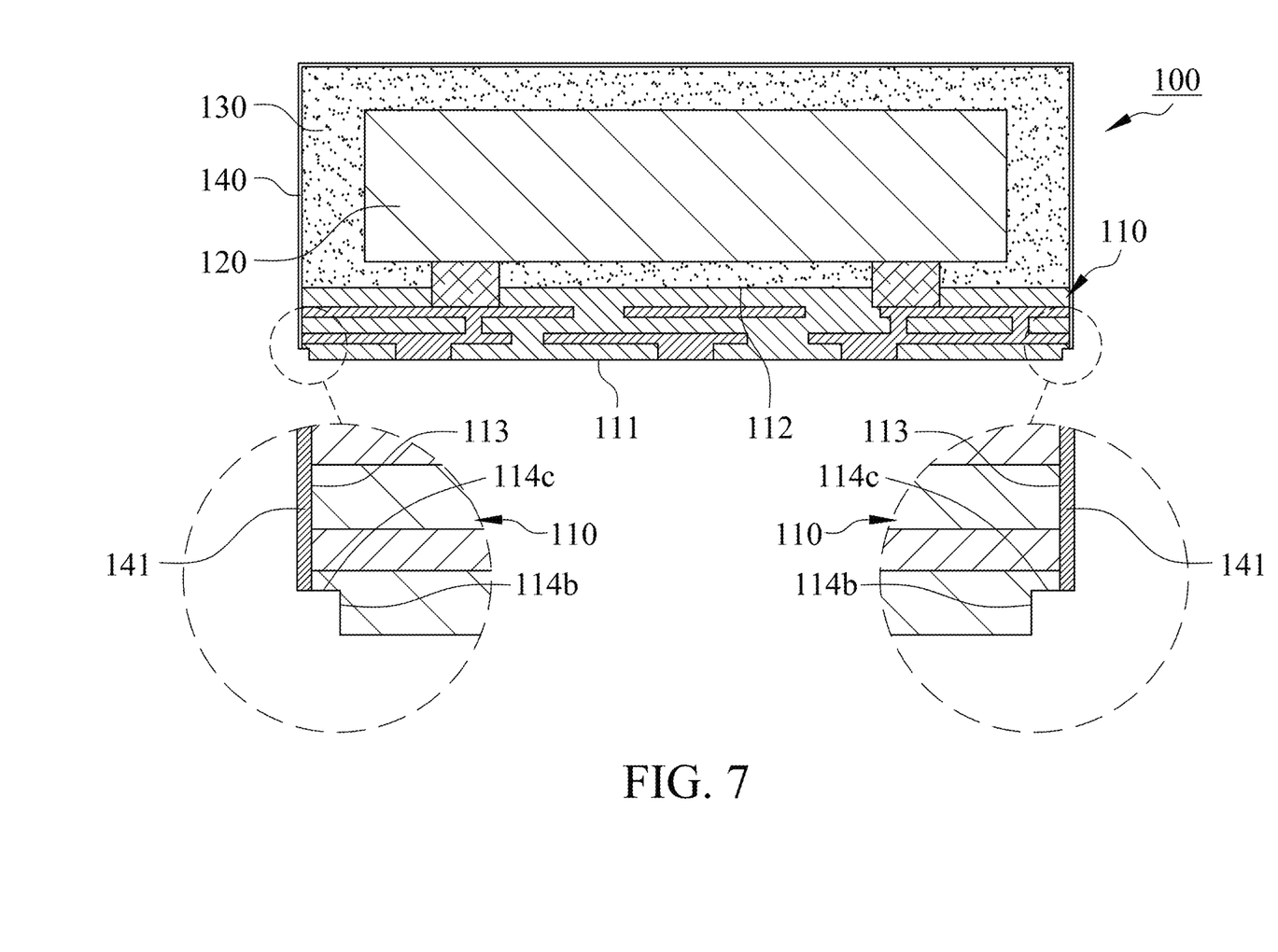
FIG. 7 is a cross-section view diagram illustrating an electronic package in accordance with another embodiment of the present invention.

With reference to FIG. 7, in another embodiment, owing to the second surface 114c of the notch 114 can provide a shelter, the second shielding portion 142 and the third shielding portion 143 will not be formed on the first surface 114b and the second surface 114c of the notch 114. After removing the second carrier 20 and the portion 14a to be removed, the space 114a of the notch 114 is visible from the shielding case 140, and it is able to prevent the portion 14a to be removed from remaining on the electronic package 100.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:
1. An electronic package comprising:
 a circuit layer including a first conductive surface, a second conductive surface, an encircled surface and a notch, the encircled surface is located between the first and second conductive surfaces, the notch is located on the encircled surface and has a space;

an electronic element mounted on the second conductive surface of the circuit layer;

an encapsulating body configured to encapsulate the electronic element and cover the second conductive surface of the circuit layer; and a shielding case including a first shielding portion which is configured to cover the encapsulating body, wherein the first shielding portion is configured to not cover the space of the notch, wherein the notch has a first surface and a second surface, the first surface is connected to the first conductive surface of the circuit layer and covered by a second shielding portion of the shielding case, and wherein a second thickness of the second shielding portion is less than a first thickness of the first shielding portion that is covering a side surface of the encapsulating body and a side surface of the circuit layer.

2. The electronic package in accordance with claim 1, wherein the second surface of the notch is connected to the encircled surface of the circuit layer and covered by a third shielding portion of the shielding case.

3. The electronic package in accordance with claim 2, wherein a third thickness of the third shielding portion is less than the first thickness of the first shielding portion.

4. The electronic package in accordance with claim 2, wherein one side of the third shielding portion is connected to the first shielding portion, and the other side of the third shielding portion is connected to the second shielding portion.

5. The electronic package in accordance with claim 4, wherein the encircled surface of the circuit layer is covered by the first shielding portion, and the first shielding portion is connected to the third shielding portion.

6. A method of manufacturing an electronic package comprising the steps of:

mounting a plurality of electronic elements on a second bonding surface of a circuit structure;

encapsulating the plurality of electronic elements by an encapsulating layer, the second bonding surface of the circuit structure is covered by the encapsulating layer;

placing the encapsulating layer on a first carrier to expose a first bonding surface of the circuit structure;

forming a plurality of first grooves on the first bonding surface of the circuit structure along a cutting line;

forming a second groove in each of the plurality of first grooves to allow the circuit structure to become a plurality of circuit layers each having a first conductive surface and a second conductive surface and allow the encapsulating layer to become a plurality of encapsulating bodies, wherein a semi-finished electronic package includes one of the plurality of circuit layers, one of the plurality of electronic elements mounted on the second conductive surface and one of the plurality of encapsulating bodies configured to encapsulate the plurality of electronic elements, and wherein a second width of the second groove is less than a first width of each of the plurality of first grooves such that each of the plurality of circuit layers has an encircled surface and a notch located on the encircled surface;

placing the semi-finished electronic package on a second carrier to allow the circuit layer of the semi-finished electronic package to be faced toward a surface of the second carrier, wherein the encapsulating body of the semi-finished electronic package, the encircled surface and the notch of the circuit layer of the semi-finished electronic package and the surface of the second carrier are exposed;

forming a shielding layer which includes a portion to be removed and a first shielding portion, the surface of the second carrier is covered by the portion to be removed, the encapsulating body of the semi-finished electronic package is covered by the first shielding portion, wherein a space of the notch is not covered by the shielding layer; and removing the second carrier and the portion to be removed of the shielding layer to allow the semi-finished electronic package to become an electronic package and allow the shielding layer to become a shielding case which is configured to cover the electronic package, the shielding case includes the first shielding portion and is configured to not cover the space of the notch, wherein the notch has a first surface and a second surface, the first surface is connected to the first conductive surface of each of the plurality of circuit layers, the shielding case includes a second shielding portion after removing the second carrier and the portion to be removed of the shielding layer, the first surface of the notch is covered by the second shielding portion, and wherein a second thickness of the second shielding portion is less than a first thickness of the first shielding portion that is covering a side surface of the encapsulating body and a side surface of the circuit layer.

7. The method in accordance with claim 6, wherein an end of the portion to be removed of the shielding layer is connected to the second shielding portion and is in the space of the notch, a fourth thickness of the end of the portion to be removed is less than or equal to the second thickness of the second shielding portion.

8. The method in accordance with claim 7, wherein a thickness of the portion to be removed of the shielding layer is decreased gradually toward the notch.

9. The method in accordance with claim 6, wherein the second surface of the notch is connected to the encircled surface, the shielding case includes a third shielding portion after removing the second carrier and the portion to be removed of the shielding layer, the second surface of the notch is covered by the third shielding portion.

10. The method in accordance with claim 9, wherein a third thickness of the third shielding portion is less than the first thickness of the first shielding portion.

11. The method in accordance with claim 9, wherein one end of the third shielding portion is connected to the first shielding portion, and the other end of the third shielding portion is connected to the second shielding portion.

12. The method in accordance with claim 11, wherein the first shielding portion is configured to cover the encircled surface and is connected to the third shielding portion.

13. The method in accordance with claim 6, wherein a thickness of the portion to be removed of the shielding layer is decreased gradually toward the notch.

14. The method in accordance with claim 6, wherein the circuit structure includes a first dielectric layer, a second dielectric layer and at least one circuit line which is located between the first and second dielectric layers, the plurality of first grooves are formed on the first dielectric layer.

* * * * *